United States Patent
Toyonaga et al.

[19]

[11] Patent Number: 5,963,730
[45] Date of Patent: *Oct. 5, 1999

[54] METHOD FOR AUTOMATING TOP-DOWN DESIGN PROCESSING FOR THE DESIGN OF LSI FUNCTIONS AND LSI MASK LAYOUTS

[75] Inventors: Masahiko Toyonaga, Hyogo; Michiaki Muraoka, Nara; Hirokazu Iida, Osaka, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/717,670

[22] Filed: Sep. 23, 1996

[30] Foreign Application Priority Data

Sep. 26, 1995 [JP] Japan .................................. 7-247241

[51] Int. Cl.$^6$ ...................................................... G06F 17/50
[52] U.S. Cl. ............................... 395/500.09; 395/500.04; 395/500.19
[58] Field of Search ................................... 364/488–491; 326/41, 101; 307/465

[56] References Cited

U.S. PATENT DOCUMENTS

| | | | |
|---|---|---|---|
| 5,045,725 | 9/1991 | Sasaki et al. ........................... | 307/465 |
| 5,402,357 | 3/1995 | Schaefer et al. ....................... | 364/490 |
| 5,430,397 | 7/1995 | Itoh et al. .............................. | 326/101 |
| 5,517,132 | 5/1996 | Ohara .................................... | 326/41 |
| 5,530,654 | 6/1996 | Takahashi .............................. | 364/488 |
| 5,537,580 | 7/1996 | Giomi et al. ........................... | 364/488 |
| 5,623,418 | 4/1997 | Rostoker et al. ...................... | 364/489 |

OTHER PUBLICATIONS

Ramachandran et al. Combined Topological and Functionality–Based Delay Estimation Using A Layout–Driven Approach For High–Level Applications, IEEE, pp. 1450–1460., Dec. 1994.

Kedem et al. "ASIC Design With Oasis," IEEE, pp. 2581–2583, 1990.

*Primary Examiner*—Kevin J. Teska
*Assistant Examiner*—Vuthe Siek
*Attorney, Agent, or Firm*—McDermott, Will & Emery

[57] ABSTRACT

A netlist between functional macros is entered. Based on the netlist, an outline layout process for a functional macro is performed and physical specifications for the functional macro are determined from an outline layout produced by the outline layout process. Thereafter, a logic synthesis process is performed on the basis of the physical specifications determined. Based on the outline layout, a logic, obtained by the logic synthesis, is laid out. This makes it possible to reduce the number of times a circuit synthesis process is redone, taking into account a laying-out at an upper-stage functional design process in which no gate level is specified. For this reason, an improved LSI automatic design method is provided which is able to complete an LSI layout design, in which the LSI area and the LSI delay value are optimized, in a short period of time.

10 Claims, 16 Drawing Sheets

INTRAGROUP
WIRING

BALANCE
WIRING

NON-BALANCE
WIRING

```
MODULE CIRCUIT_100 (A, B, C, D, E, F, G, H)
    INPUT  A, B, C, D, E, F ;
    OUTPUT G, H ;
    G = ( A + B *)   F ;
    IF ( C -- 1 ) THEN
        H = B - E ;
    ELSE
        H = D - E;
    ENDIF
ENDMODULE ;
```

FIG. 16

```
MODULE CIRCUIT_100 ( A, B, C, D, E, F, CLK, G, H )
    INPUT    A, B, C, D, E, F ;
    CLOCK    CLK ;
    OUTPUT G, H ;
    a ( a.o ) = REG (A, CLK) ;
    b ( b.o ) = REG (B, CLK) ;
    04 ( 04.o ) = SEL (b.o,  d.o,  C) ;
    d ( d.o ) = REG (D, CLK) ;
    e ( e.o ) = REG (E, CLK) ;
    f ( f.o ) = REG (F, CLK) ;
    01 ( 01.o ) = ADD (a.o, b.o) ;
    02 ( 02.o ) = MULT (01.o, f.o) ;
    g ( G ) = REG ( 02.o, CLK ) ;
    03 ( 03.o ) = SUB (04.o, e.o) ;
    b ( H ) = REG ( 03.o, CLK) ;
ENDMODULE ;
```

FIG. 17

METHOD FOR AUTOMATING TOP-DOWN DESIGN PROCESSING FOR THE DESIGN OF LSI FUNCTIONS AND LSI MASK LAYOUTS

BACKGROUND OF THE INVENTION

1. Technical Field

The present invention relates to an improvement in LSI (large-scale integrated circuit) automatic design technology for automating top-down design processing from the design of LSI functions to the design of LSI mask layouts.

2. Technical Background

In recent years the market life of electronic apparatus that employ LSIs has been reduced and their performance has been improved. There have been demands in the field of design automation (DA) technology for (1) reduction of the design time and (2) high-quality design (high performance).

Prior art DA techniques, however, have the following problems.

(A) Tool processes at different design stages are independently performed, which makes it impossible to adequately perform upper-stage processing while taking into account lower-stage processing (for example, a layout design process), in other words no optimum processing can be achieved.

(B) It is difficult to exactly predict, at a tool process of one design stage, another tool process of the other design stage. This results in producing the difference between (a) a wiring delay that is assumed in an upper-stage logic design process and (b) a wiring delay from a layout result obtained in a lower-stage layout design process. Accordingly, in some cases the wiring delay (b) may exceed the wiring delay (a).

As a solution to these problems, a technique known as "timing driven" has been proposed recently. In accordance with this timing driven technique, upper-stage processing and lower-stage processing are related with each other and constraints, which satisfy a delay assumed in an upper-stage logic design process, are placed on an upper-stage layout design process, in order to cope with the drawbacks (A) and (B).

Additionally, placement techniques, which take in account a delay between registers, have been developed in the layout design from logic gate level, to obtain results that satisfy timing constraints.

However, in conventional techniques, timing constraints are placed one-sidedly from an upper-stage logic design process under no physical constraints, onto a lower-stage layout design process under physical constraints. Accordingly, in some cases it may become impossible, due to various other layout constraints such as placement positions and wiring relations, to produce a layout result that satisfies a timing constraint. In such a case, it is necessary to make a change in the circuit configuration. It is therefore required to redo a circuit synthesis process over again and thereafter to find a layout result that satisfies the constraints of timing. However, both the circuit synthesis and the layout design are a time-consuming process. It takes, for example, about one week to finish such processing. This not only prolongs the LSI development period but also increases the LSI production cost.

To be immune from the foregoing problems, it can be thought of setting a wiring delay, assumed in a logic design process, to such an extent that the wiring delay can be realized even in the worst case. However, it is necessary to prepare a great number of output transistors and a faster circuit structure is required. As a result, the scale of circuit increases, therefore presenting the problem that the cost of LSI products increases.

Such problems occur to both clock wiring and scan path wiring. It is impossible to predict the post-layout position of clock input elements such as registers in a logic design process. This increases the length of clock wiring, inevitably leading to an increase in the power consumption, to the occurrence of malfunctions due to clock skew and to an increase in the wiring area. Additionally, an increase in the wiring area due to scan path wiring occurs for the same reason.

The root of the problem in question may be circumvented by taking into account a laying-out at the time of a logic design process. It is, however, difficult to determine a circuit-scale specification or a delay-value specification in an upper-stage functional design process and it is therefore difficult to become aware of a lower-stage layout in an upper-stage functional design process. For this reason, conventionally a laying-out is considered at, for example, the stage of gate level. In such a case, however, a laying-out is considered at the gate level stage (the lower stage), so that it is hard to make a great change in the circuit area as well as in the delay value. Accordingly, it is necessary to repeat a circuit synthesis process over again and the foregoing problem cannot be solved basically.

SUMMARY OF THE INVENTION

Accordingly, it is an object of the present invention to provide an improved LSI automatic design method. More specifically, the present LSI automatic design method reduces, for example, the redone of logic synthesis by taking into account a laying-out at an upper-stage functional design process in which no gate level is determined, whereby the layout design of LSIs, in which the LSI area and the LSI delay are optimized, can be completed in a short period of time. In the present invention, in order to have a layout-consciousness in the upper-stage functional design, a plurality of small-scale circuits (functional macros) that have a definite function are roughly laid out in a functional design process. From the outlined layout obtained, each macro's physical specifications, such as area and delay specifications, are determined and, based on the outlined layout and on the physical specifications, a lower-stage logic synthesis process and a detailed layout process are executed.

It is another object of the present invention to adequately determine rough layouts and physical specifications for a plurality of functional macros in an upper-stage functional design process in such a case.

The present invention provides an improved LSI automatic design method by means of design automation on the basis of the arithmetic/storage functioning of an electronic computer. This LSI automatic design method comprises:

(a) a netlist input process of inputting a netlist between functional macros;

(b) a macro outline layout process of creating an outline layout for functional macros on the basis of the netlist and for determining a physical specification for the functional macros from the outline layout;

(c) a logic synthesis process of performing synthesis processing under the physical specification; and (d) a layout process of laying out logic circuits obtained in the logic synthesis process on the basis of the outline layout.

In accordance with the present invention, the macro outline layout process comprises the following processes. The macro outline layout process includes:

(a) an input process of inputting correlation information between the area and the delay of each functional macro;

(b) a relative placement process for determining a relative placement among a plurality of functional macros;

(c) a wiring delay calculation process for estimating the length of each wiring for interconnecting functional macros in the relative placement and for calculating, based on each of the estimated wiring lengths, a maximum wiring delay;

(d) a macro delay/area decision process of determining, based on the correlation information, an area and delay combination for each functional macro in order that the maximum wiring delay falls in the range of predetermined LSI specifications; and (e) an outline special wiring process of roughly performing special wiring, such as clock wiring and scan path wiring, between relative positions of the plurality of functional macros in the relative placement.

In the present invention, after a netlist between functional macros is entered, schematic layouts and physical specifications for a plurality of functional macros are determined adequately on the basis of the entered netlist in a functional design process in which no gate levels are determined. These outline layouts and physical specifications are determined by taking in account physical constraints for logic synthesis and detail layout processes at later stages. As a result of such arrangement, in many cases given timing constraints are satisfied when performing logic synthesis and detail layout processing. This reduces the number of times a logic synthesis process is redone and also reduces the LSI development time.

Particularly in the foregoing functional macro outline layout, the physical specifications of the functional macro area and delay are optimized and the lengths of interconnections among functional macros are adequately estimated, which are pre-considered at the logic synthesis stage. As a result, in many cases the execution of the detail layout process guarantees desirable LSI performance.

The present invention's objects and features will be better understood from the following description when considered with the accompanying drawings.

BRIEF DESCRIPTION OF THE DRAWINGS

The accompanying drawings show preferred embodiments of the present invention in which:

FIG. 16 shows a circuit example represented by means of a description language; and FIG. 17 shows an RTL description that represents the FIG. 16 circuit by means of functional macros.

DETAILED DESCRIPTION OF THE INVENTION

A preferred embodiment of the present invention is described with reference to the accompanying drawings.

Figure 9:
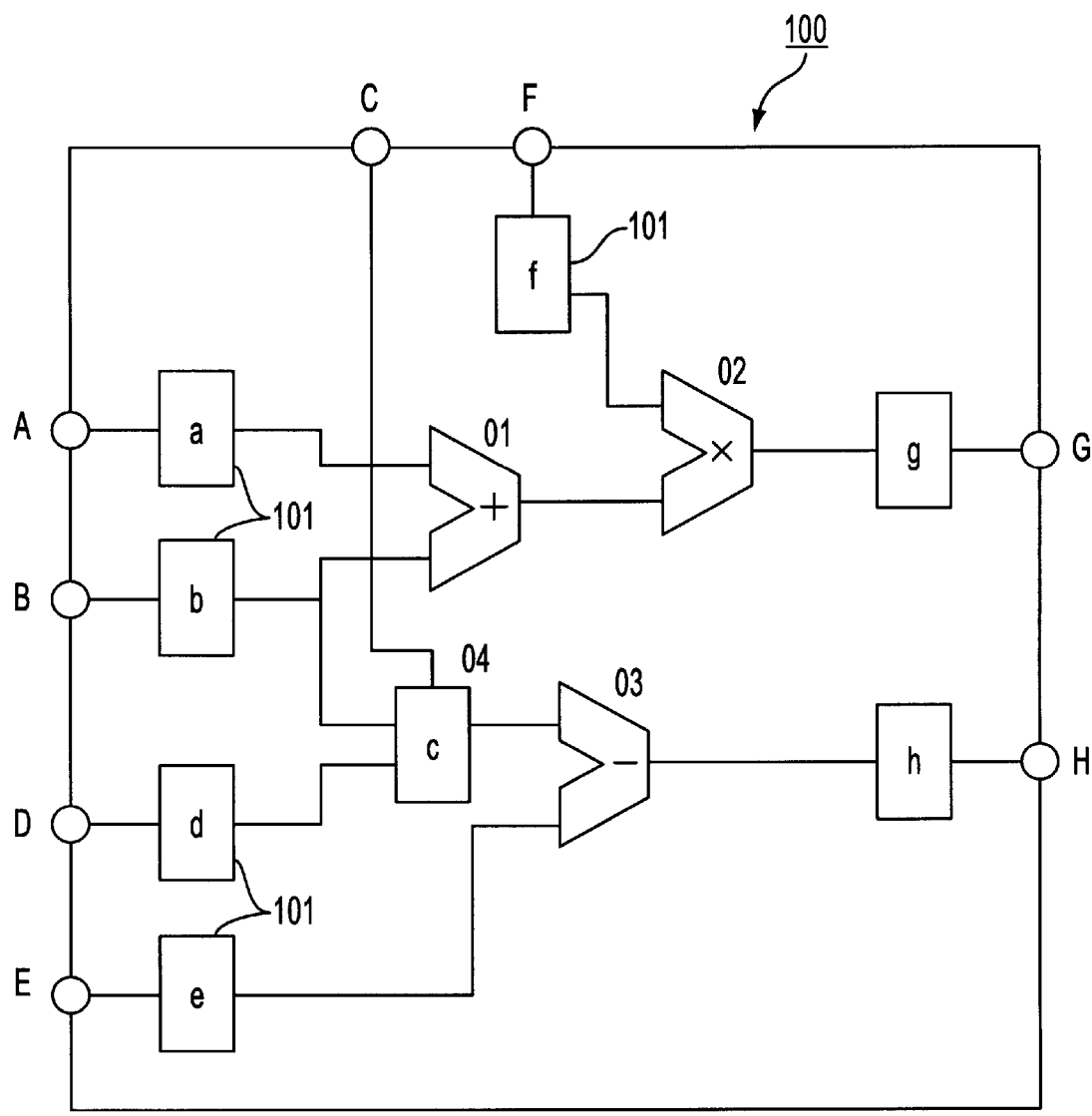
FIG. 9 is a diagram showing an example of a circuit of RTL (register transfer level) in the LSI automatic design method.

A circuit 100, shown in FIG. 9, is used to illustrate an LSI automatic design method of the present invention.

The functions of the circuit 100 of FIG. 9 are represented by a functional description of FIG. 16. Referring to FIG. 16, the functions of the circuit 100 is described. More specifically, the circuit 100 provides a result of multiplying a sum of the signal A and the signal B by the signal F in the form of the signal G. When the control signal C is "1", the circuit 100 provides a result of subtracting the signal E from the signal B in the form of the signal H. On the other hand, when the control signal C is "0", the circuit 100 provides a result of subtracting the signal E from the signal D in the form of the signal H.

The circuit 100 of FIG. 9 is represented by functional macros, or by small-scale circuits that have a definite logic function. With reference to FIG. 17, there is shown an RTL description that represents the circuit 100 with functional macros. Each of the functional macro is prepared in a library, as a functional description. Referring to FIGS. 9 and 17, the circuit 100 has input terminals A to F and output terminals G and H. Each functional macro a, b, d, e and f is a storage functional macro called as a register 101. 01, 02, 03 and 04 are functional macros implementing an adder, a multiplier, a subtracter and a selector, respectively. A clock signal necessary for the actual operation of the circuit 100, not shown in FIG. 9, is applied to each of the registers 101. Each of the input/output signals A to F is 4 bits width and is represented by a single signal line composed of four bit signal lines in FIG. 9. In the rules of the FIG. 17 RTL description, in a module (a) a circuit name and input/output terminal names are declared, (b) a terminal input/output declaration, a placement proper name and an output signal name are described on the left side while a functional macro name and an input signal name are described on the right side.

In the FIG. 17 RTL description, MULT, REG, ADD, SUB, and SEL represent a multiplier, a storage device, an adder, a subtracter and a selector, respectively.

The present invention is characterized as follows. An outline layout process is performed at the upper stage of the circuit 100 of register transfer level. As a result of such arrangement, both logic synthesis specifications and layout specifications can be controlled at earlier design stages in comparison with a convention design technique of logic gate level at the lower stage, whereby post-layout performance is guaranteed desirably. This prevents a design process from having to be redone. The development time is shortened and performance is improved.

The present LSI automatic design method is described below in detail.

Figure 1:
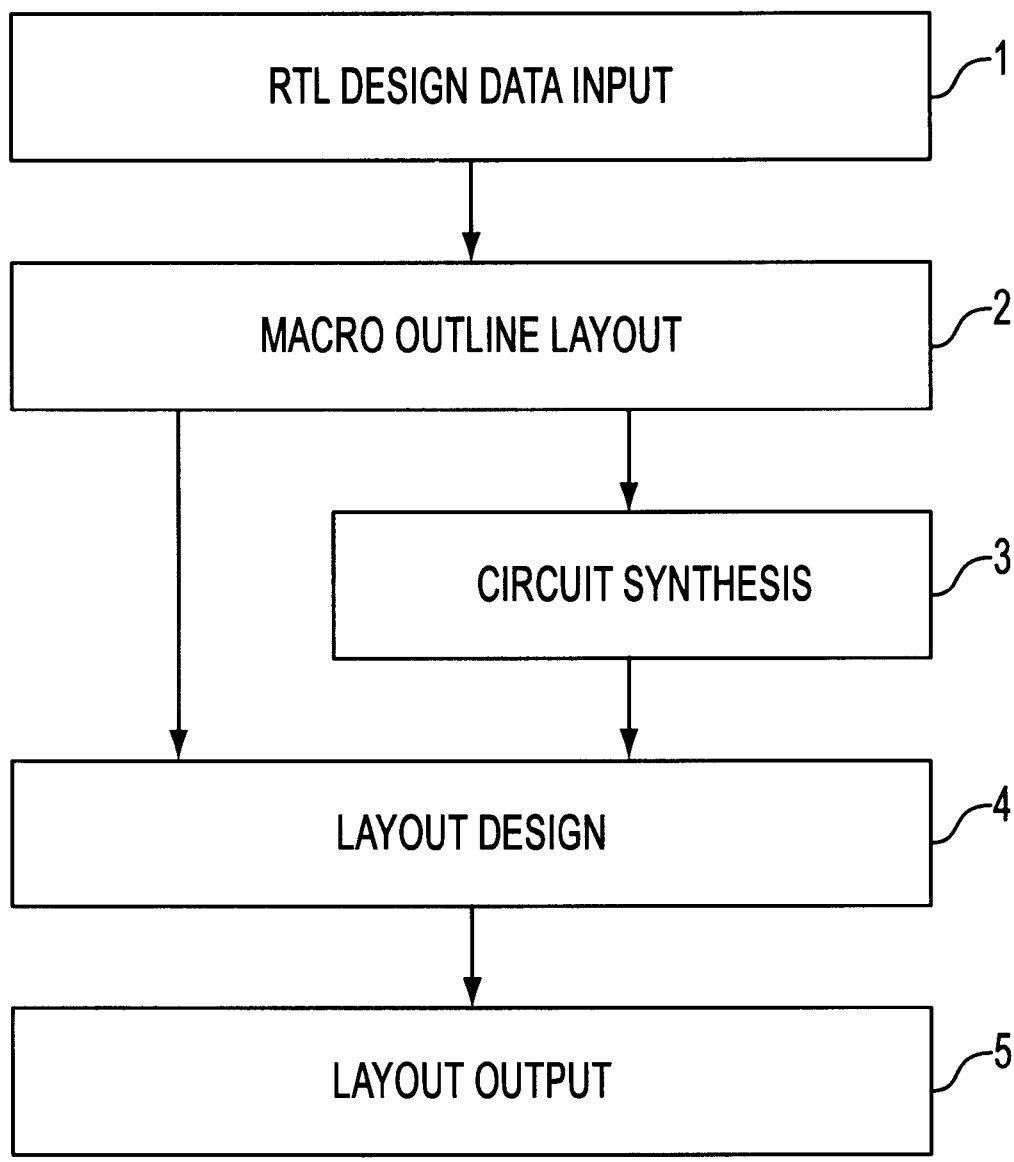
FIG. 1 is a flow chart of an LSI automatic design method of the present invention.

Referring now to FIG. 1, a netlist (RTL design data) for the circuit 100 shown in FIG. 17 is entered (step 1).

Next, a macro outline layout (MOL) process 2 is performed. This MOL process 2 is a step of determining relative positions among functional macros and partial wiring routes in a final LSI layout.

Figure 3:
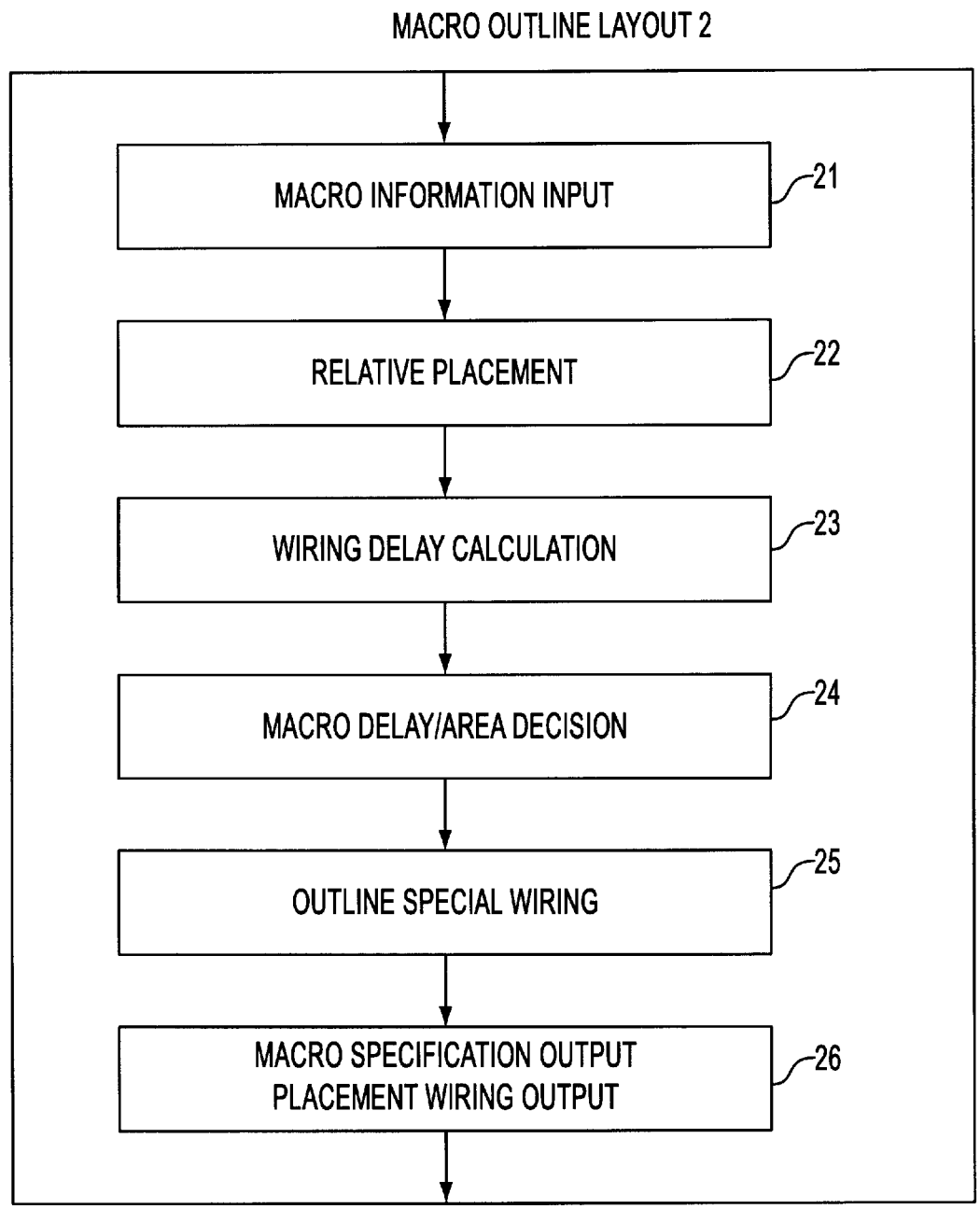
FIG. 3 is a flow chart of an outline layout process in the LSI automatic design method of the present invention.

FIG. 3 illustrates the detail of the MOL process 2. With reference to FIG. 3, a macro information input (MII) process 21 is performed. This MII process 21 is a step of inputting correlation information between the area and the delay of each functional macro. Data for each functional macro's area and delay value are prepared by pre-deriving a minimal area and a delay value for implementing each functional macro from, for example, the following empirical values shown in TABLE 1.

TABLE 1

|  | MIN. AREA | DELAY |
| --- | --- | --- |
| MULT | 100 | 30 |
| REG | 10 | 2 |
| ADD | 10 | 10 |
| SUB | 10 | 15 |
| SEL | 10 | 3 |

Figure 4:
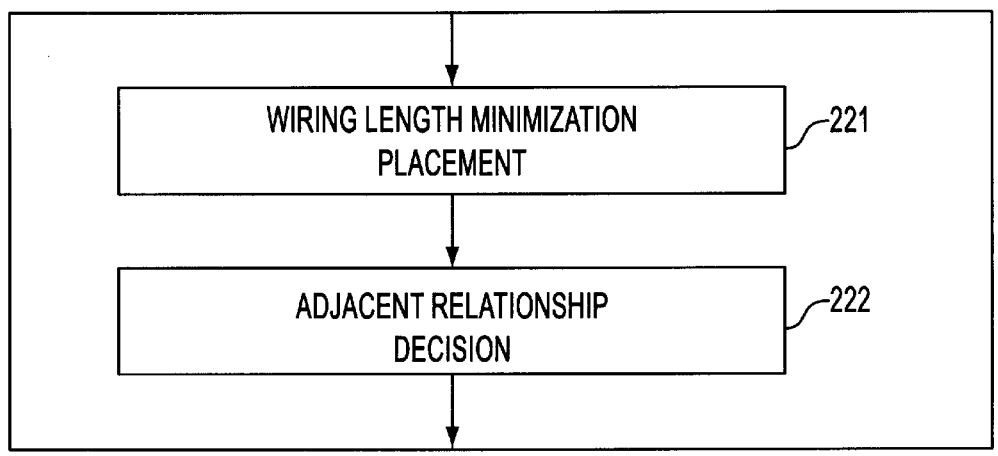
FIG. 4 is a flow chart of a relative placement process in the LSI automatic design method of the present invention.
Figure 5:
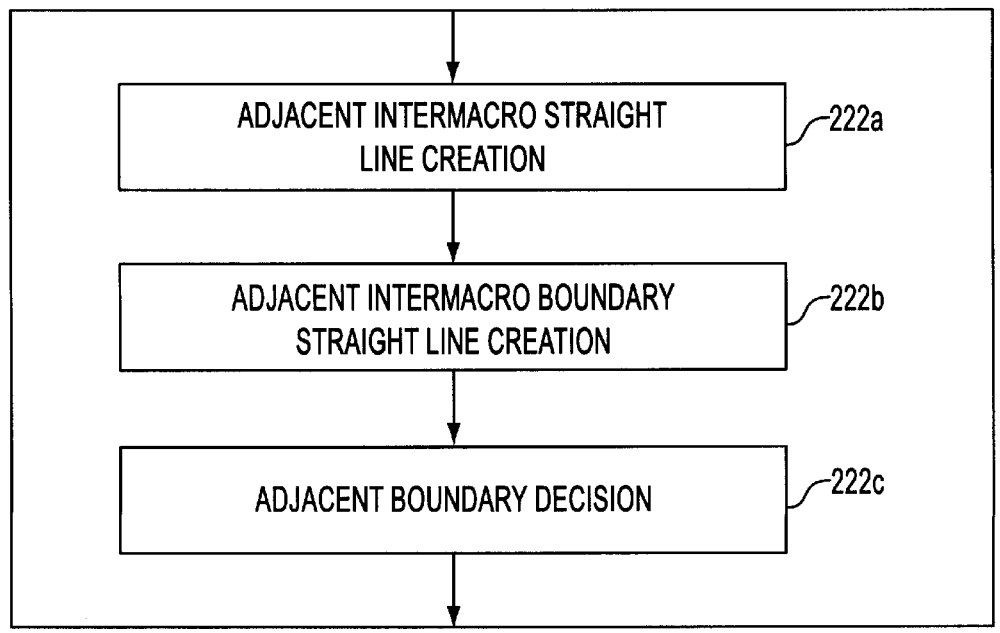
FIG. 5 is a flow chart of an adjacent relationship decision process in the LSI automatic design method of the present invention.
Figure 11A:
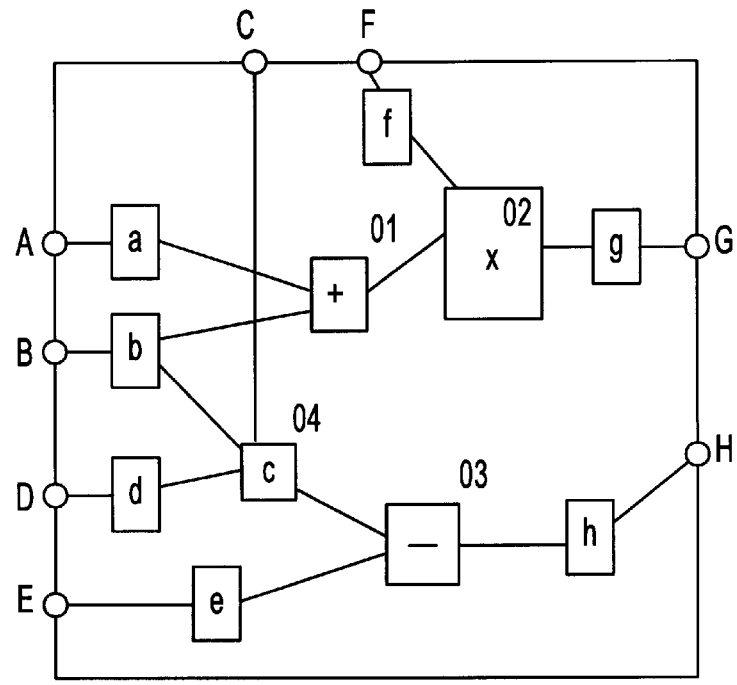
FIG. 11(a) shows a functional macro initial placement.
Figure 11B:
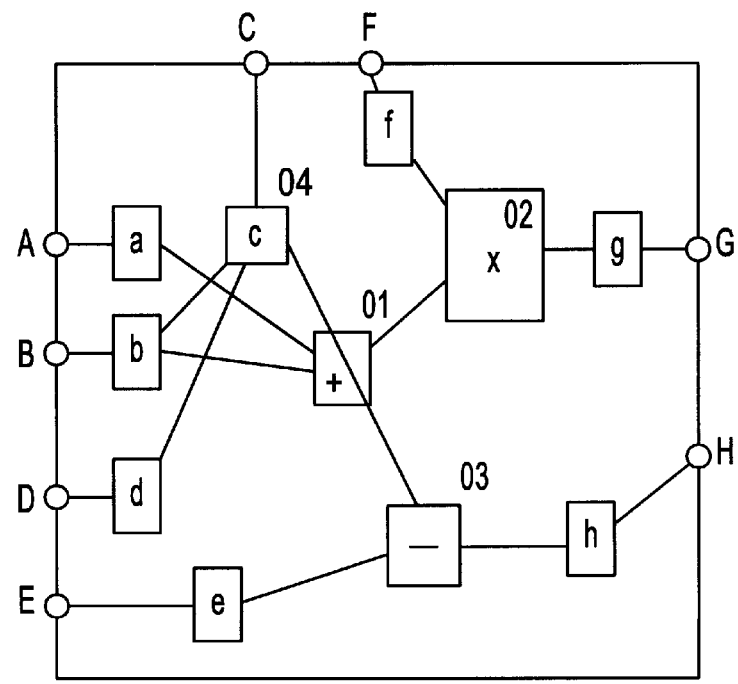
FIG. 11(b) shows a result produced by a wiring length minimization placement process.
Figure 12A:
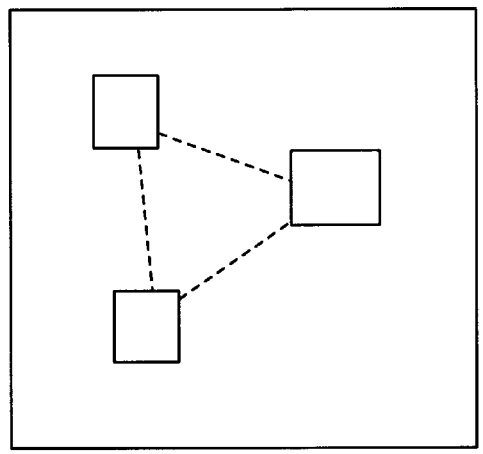
FIG. 12(a) shows a result produced by an adjacent inter-macro straight line generation process.
Figure 12B:
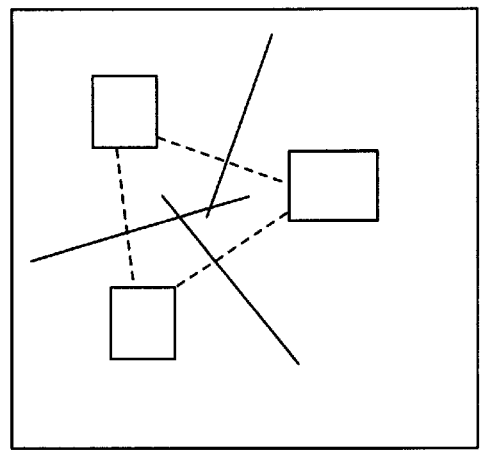
FIG. 12(b) shows a result produced by an adjacent inter-macro boundary straight line creation process.
Figure 12C:
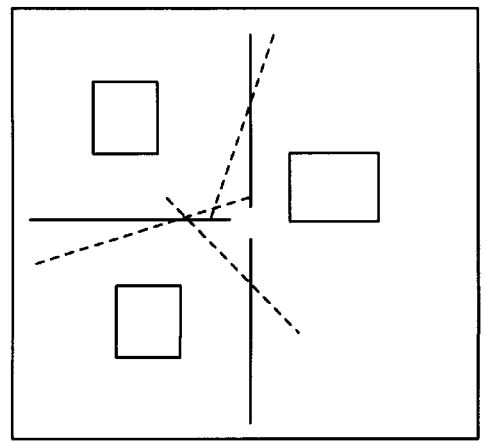
FIG. 12(c) shows a result produced by an adjacent boundary decision process.

A relative placement (RP) process 22 is performed (FIG. 3). By "relative placement" used here is meant the placement position such that a vertical/lateral relative position relationship between functional macros can be determined (see FIG. 10(b)). With reference to FIG. 4, the RP process 22 comprises a wiring length minimization placement (WLMP) process 221 and an adjacent relationship decision (ARD) process 222. The WLMP process 221 can be performed as follows. As shown in FIG. 11(a), individual functional macro elements are initially arranged according to the circuit 100 of register transfer level of FIG. 9 and thereafter a commonly-used technique for sequentially improving the position of each element (see FIG. 11(b)) is employed so as to minimize the total wiring length. FIG. 10 shows a result produced by the WLMP process 221. With reference to FIG. 5, the ARD process 222 is described in detail. The ARD process 222 comprises an adjacent intermacro straight line creation (AISLC) process 222a, an adjacent intermacro vertical boundary creation (AIVBC) process 222b and an adjacent boundary decision (ABD) process 222c. The AISLC process 222a is a step of connecting, by using a placement relationship between functional macros produced by the WLMP process 221 as a precondition, the functional macros with a straight line, as shown by a broken line of FIG. 12(a). The AIVBC process 222b is a step of providing a macro boundary straight line such that it passes through a point of the straight line interconnecting the two functional macros, wherein the point is defined by dividing the straight line by the ratio of the area of one of the functional macros to that of the other functional macro and the macro boundary straight line extends perpendicularly to the straight line, as shown by a solid line of FIG. 12(b). The ABD process 222c is a step of obtaining a slicing structure by vertically or laterally standardizing the inclination of the macro boundary straight line, as shown by a solid line of FIG. 12(c). In this way, relative placement positions for a plurality of functional macros whose areas have remained indefinite in the circuit 100 are determined as illustrated in FIG. 10(b).

Referring again to FIG. 3, a wiring delay calculation (WDC) process 23 is performed. In this WDC process 23, a wiring length is estimated on the condition that an interconnection is established on a boundary between functional macros on the basis of the relative position of the functional macros of FIG. 10 (b) of the circuit 100 found by the RP process 22 and thereafter a maximum signal propagation delay (wiring delay) is calculated from the value of resistance and the value of capacitance for the estimated wiring length and each functional macro's delay value, to find a signal propagation route for the maximum signal propagation delay.

A macro delay/area decision (MDAD) process 24 is performed (FIG. 3). This MDAD process 24 is a step of optimizing the area and the delay value of each functional macro on the basis of the correlation between the area and the delay value of each functional macro. The correlation between S (functional macro area) and D (functional macro delay value) may be obtained from TABLE 2 or from the following expression (1).

TABLE 2

| MULT | S (area) | D (delay value) |
| --- | --- | --- |
|  | 100 | 30 |
|  | 300 | 10 |
|  | 60 | 5 |

The S/D correlation functional expression (1) is as follows.

$$100 \times 30 = S \times D = \text{constant} \quad (1)$$

The expression (1) shows a way of simply finding a correlation by making utilization of data when the area is the smallest instead of using the correlation table, since in a high-speed functional macro, or in a functional macro having a lower delay value, the functional macro area tends to increase.

The MDAD process 24 minimizes the delay value of a signal propagation route within the range of areas/delay values that each functional macro can have, from the S/D correlation. More specifically, in a maximum delay route that is obtained on the basis of the wiring delay and the functional macro delay, the area of a functional macro arranged on that maximum delay route is slightly changed so as to make a change in the delay/area combination of the functional macro and a delay value improvement process is performed repeatedly so that the delay value falls in the range of a given LSI specification, whereby the delay value and the area of each functional macro are determined.

Figure 10A:
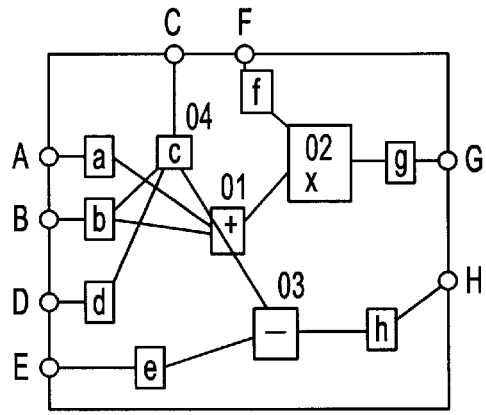
FIG. 10(a) is a schematic depicting a result produced by a wiring length minimization placement process.
Figure 10C:
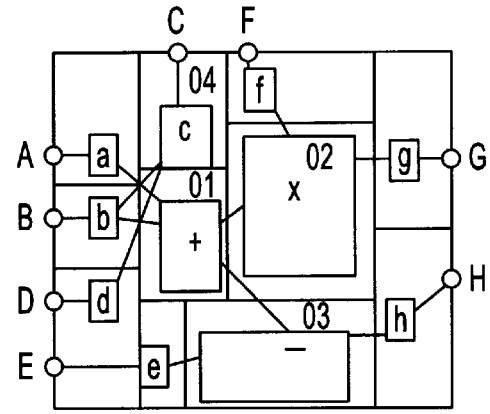
FIG. 10(c) is a schematic depicting a result produced by a macro delay/area decision process.
Figure 10B:
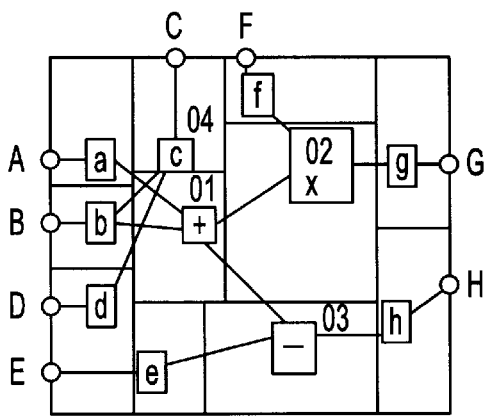
FIG. 10(b) is a schematic depicting a result produced by an adjacent relationship decision process.

In this way, each functional macro's area and delay value (its physical specifications) are determined as shown in FIG. 10(c).

An outline special wiring (OSW) process 25 is performed (FIG. 3). This OSW process 25 is a step of performing outline wiring processing on special signal lines, such as clock interconnections and scan testing interconnections.

Figure 6:
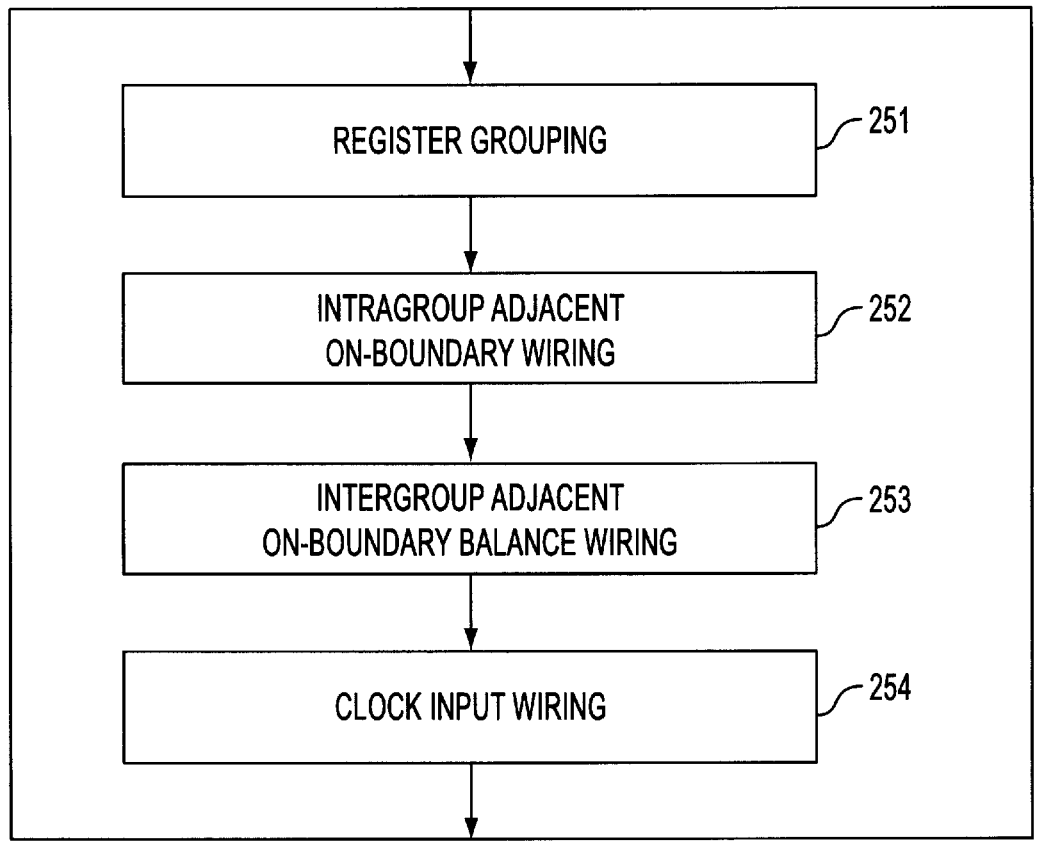
FIG. 6 is a flow chart of a clock wiring process in the LSI automatic design method of the present invention.
Figure 10D:
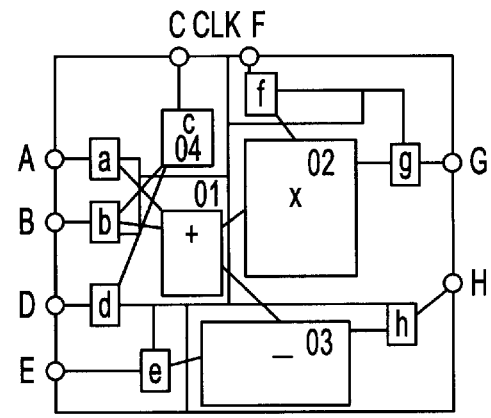
FIG. 10(d) is a schematic depicting a result produced by a clock wiring-added macro outline layout process.
Figure 13A:
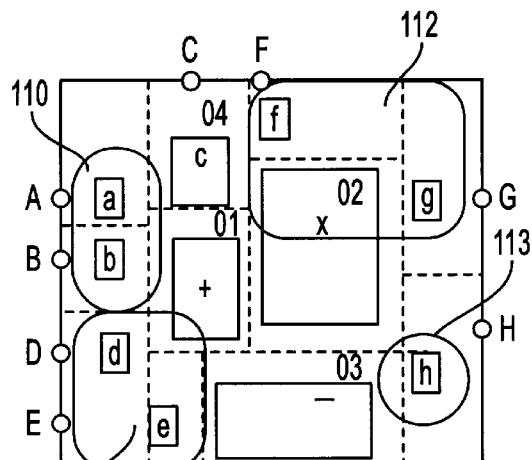
FIG. 13(a) shows a result produced by a register grouping process.
Figure 13B:
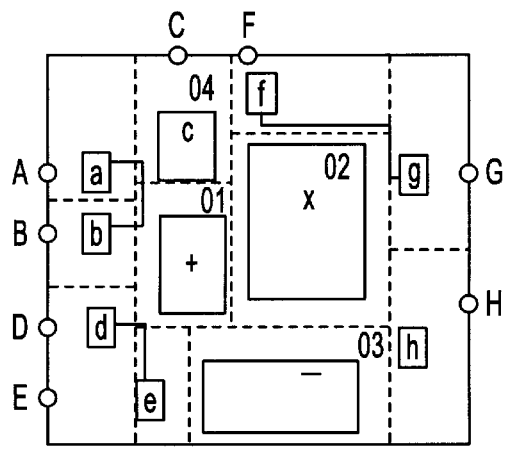
FIG. 13(b) shows a result produced by an intragroup adjacent on-boundary wiring process.
Figure 13C:
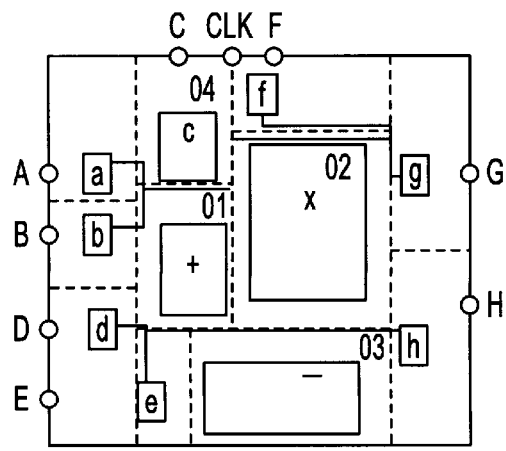
FIG. 13(c) shows a result produced by an intergroup adjacent on-boundary balance wiring process and a clock input wiring process.
Figure 14A:
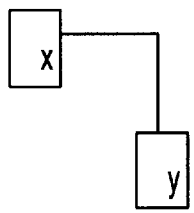
FIG. 14(a) shows a result produced by an intragroup wiring process.
Figure 14B:
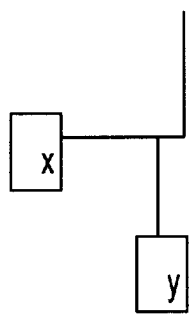
FIG. 14(b) shows a result produced by an intergroup balance wiring process.

An example of the OSW process 25 for clock wiring is illustrated with reference to FIG. 6. This wiring process is a step of wiring clock signal lines on the macro boundary straight line determined by the RP process 22, in order to constitute a balance tree between registers. The OSW process 25 of FIG. 6 has a register grouping (RG) process 251, an intragroup adjacent on-boundary wiring (IAOW) process 252, an intergroup adjacent on-boundary balance wiring (IAOBW) process 253 and a clock input wiring (CIW) process 254. The RG process 251 is a step of grouping adjacent functional macros with a register function (registers) of a plurality of functional macros so as to form four register groups 110, 111, 112 and 113, as shown in FIG. 13. The IAOW process 252 is a step of establishing interconnections between registers of each register group 110, 111, 112 and 113 on macro boundary straight lines, as shown in FIGS. 13(b) and 14(a). The IAOBW process 253 is a step of wiring the barycenters of the interconnections of each group established by the IAOW process 252 (see FIG. 14(b)). The CIW process 254 is a step of connecting an interconnection between the barycenters and a clock input terminal (clock external terminal) CLK, as shown in FIGS. 13(c) and 10(d). The uniformization of clock signal distribution is realized by the RTL circuit.

Figure 7:
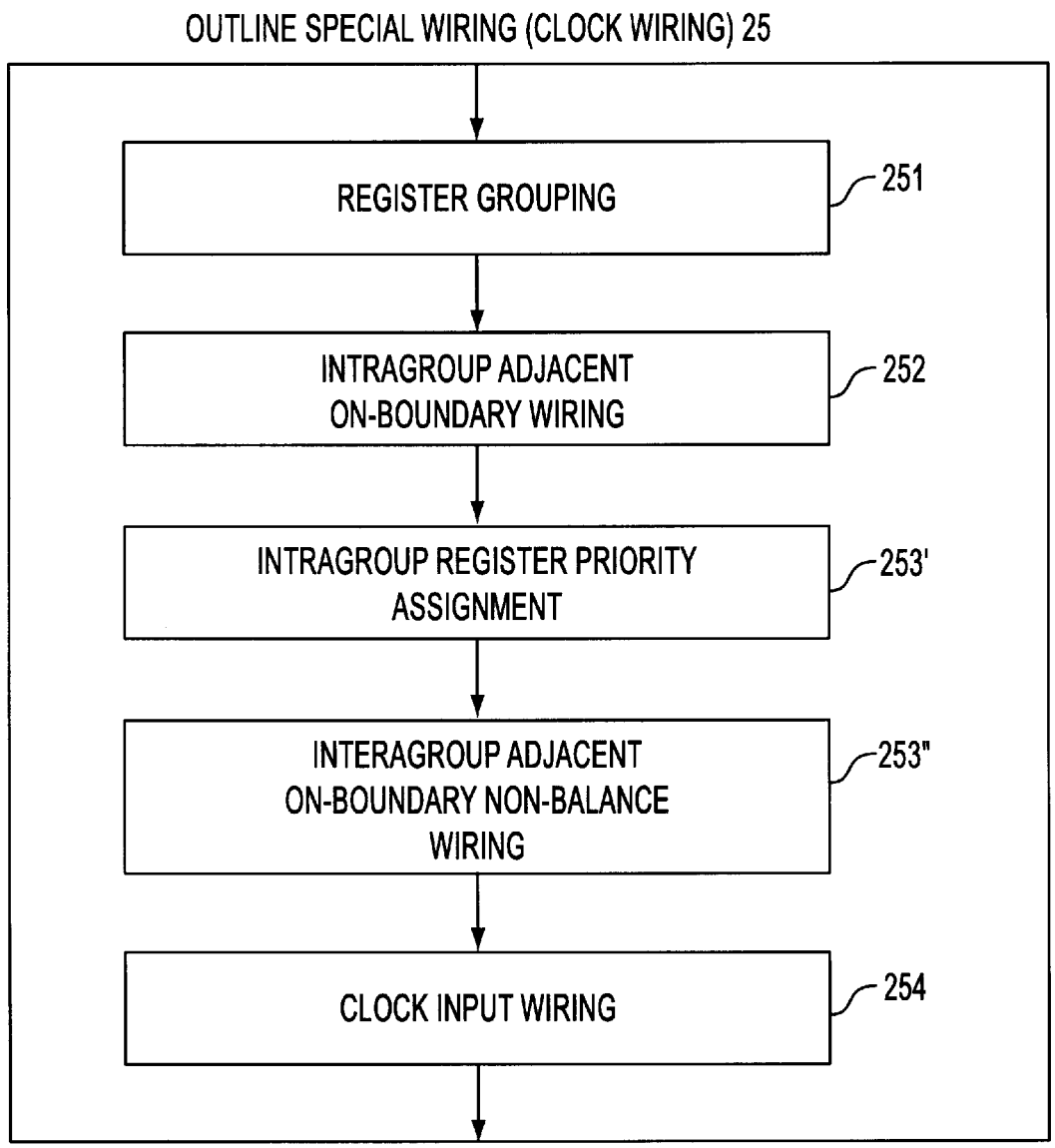
FIG. 7 is a flow chart of another clock wiring process in the LSI automatic design method of the present invention.
Figure 14C:
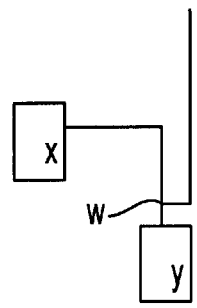
FIG. 14(c) shows a result produced by an intergroup non-balance wiring process.

Referring now to FIG. 7, there is shown another example of the OSW process 25 for clock wiring. In this example, clock signal lines are wired in order to form a non-balance tree between registers. In place of the IAOBW process 253 of FIG. 6, there are provided an intragroup register priority assignment (IRPA) process 253' and an intergroup adjacent on-boundary non-balance wiring (IAONW) process 253". The IRPA process 253' is a step of examining the data transfer relationship among registers of each group and of assigning priorities to the registers by weights in the order of data transfer, or in the order of length of the time required for their respective data transfer. The IAONW process 253' is a step of calculating w (the barycenter of an intragroup interconnection) by the weight on the basis of the intragroup priority (the register Y requires a longer data transfer time in FIG. 14(c)), to establish w-to-w interconnection. In this way, clock wiring, which can prevent the occurrence of clock skew, can be realized.

Figure 8:
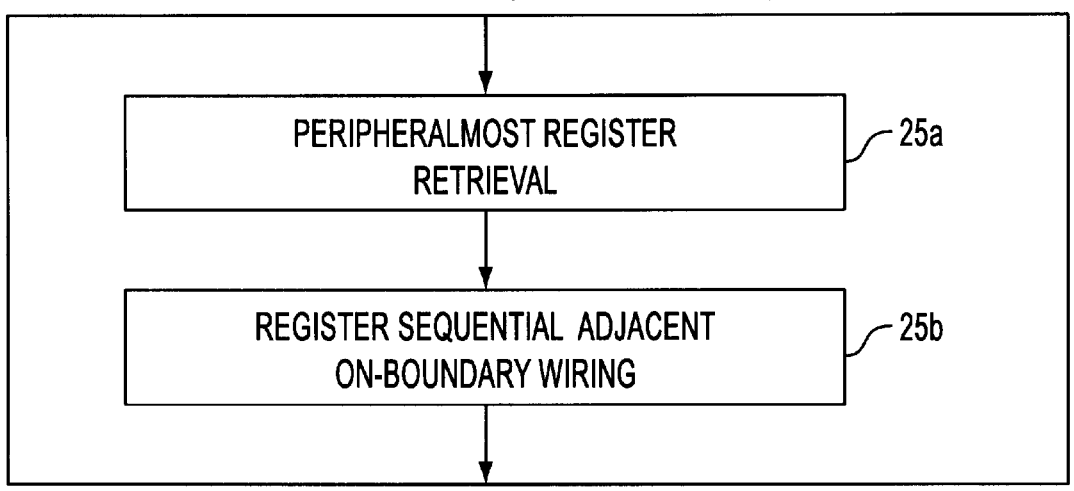
FIG. 8 is a flow chart of a scan path wiring process in the LSI automatic design method of the present invention.
Figure 15A:
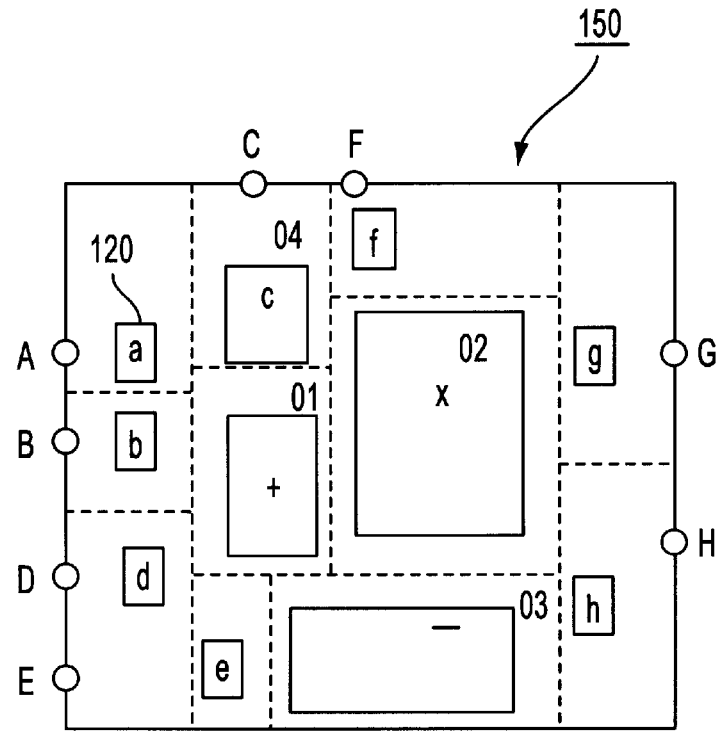
FIG. 15(a) shows a result produced by a peripheralmost register retrieval process.
Figure 15B:
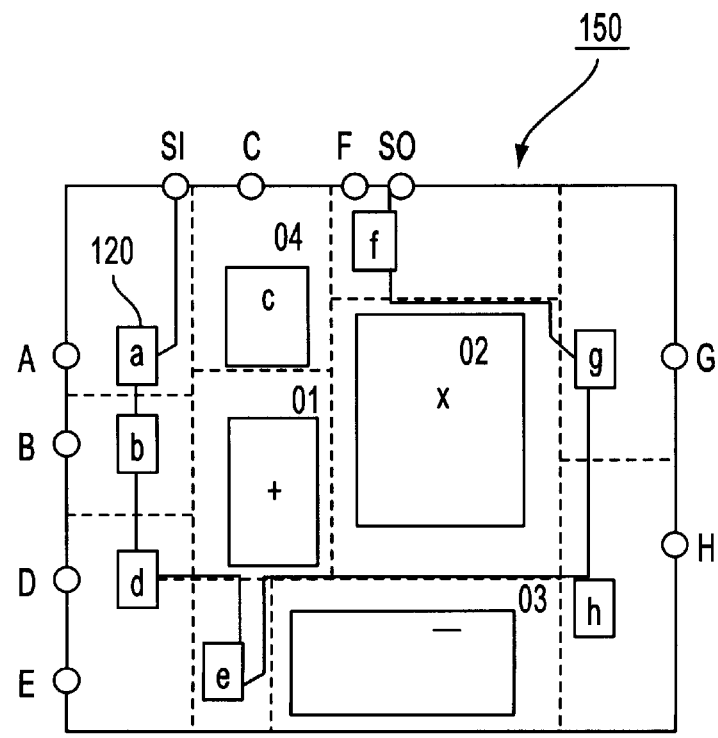
FIG. 15(b) shows a result produced by a register sequential adjacent on-boundary wiring process.

FIG. 8 shows an example of the OSW process 25 when applied to scan wiring. The OSW process 25 of FIG. 8 is a scan chain wiring technique and comprises a peripheralmost register retrieval (PRR) process 25a and a register sequential adjacent on-boundary wiring (RSAOW) process 25b. The PRR process 25a is a step of retrieving a register 120 that is the nearest register to the peripheral of the circuit 150 on the relative placement boundary (see FIG. 15(a)). The RSAOW process 25b is a step of sequentially interconnecting adjacent registers. More specifically, in the RSAOW process 25b the register 120 is first connected with a second register arranged nearest to the register 120, the second register is then connected with a third register arranged nearest to the second register and so on.

In this way, the scan path wiring capable of reducing the layout area is realized at the RTL. The OSW process 25 is now completed.

An output process 26 is performed (FIG. 3). This output process 26 is a step of providing the functional macro area and delay specifications and the functional macro placement and wiring results determined by the processes 21 to 25.

After the MOL process 2 is finished, a circuit synthesis (CS) process 3 is performed (FIG. 1). The CS process 3 is a step of synthesizing logic circuits under the foregoing functional macro area/delay specifications generated in the above-described processes. This CS process 3 can be executed using commercially available logic synthesis tools.

Next, a layout synthesis (LS) process 4 is performed. This LS process 4 is a step of performing a layout process from the logic circuits synthesized by the CS process 3, the relative placement between these logic circuits and clock wiring information. The LS process 4 can be performed using commercially available logic synthesis tools.

Next, in a layout output (LO) process 5, the execution result of the LC process 4 is provided to the outside.

Figure 2:
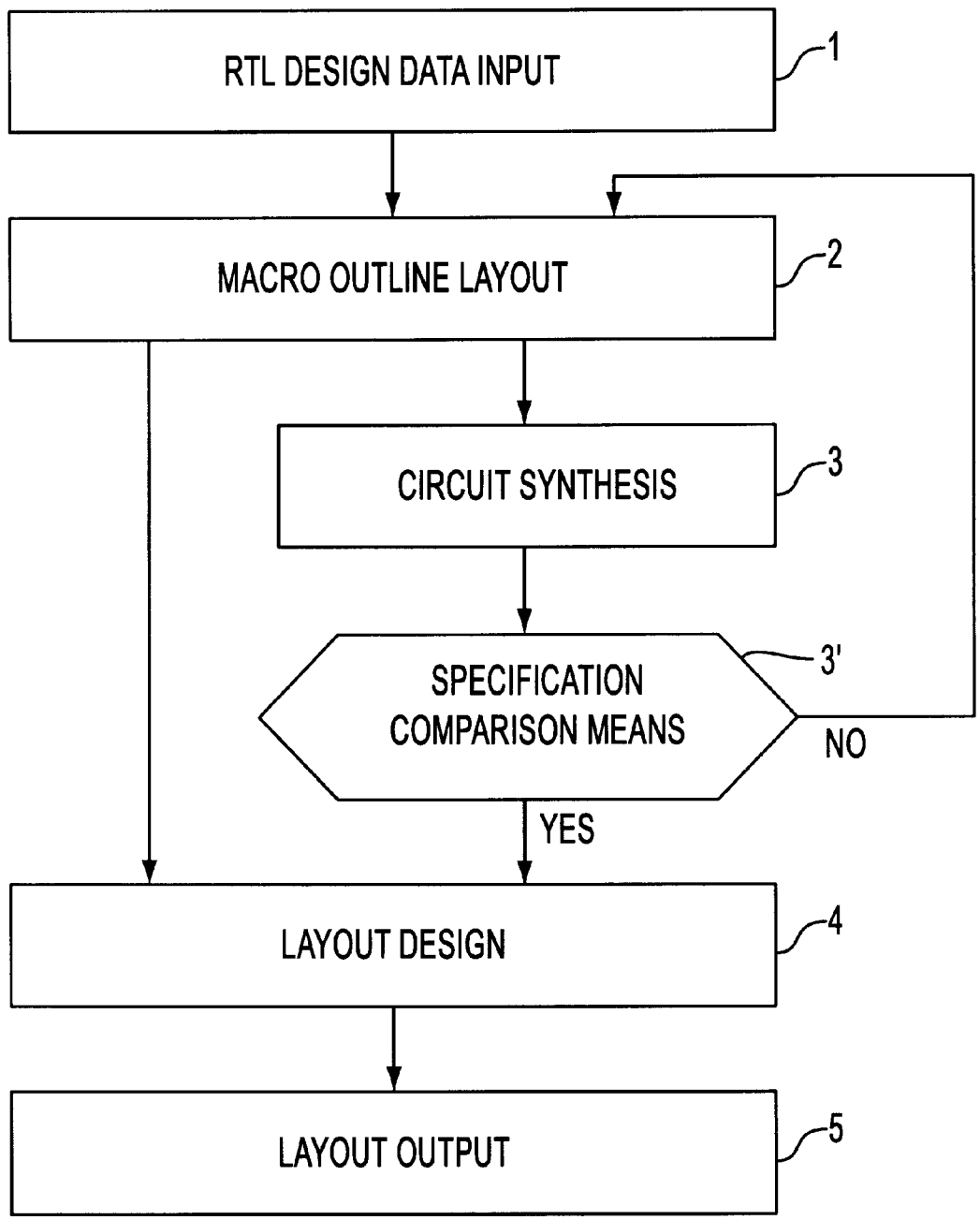
FIG. 2 is a flow chart of another LSI automatic design method of the present invention.

As shown in FIG. 2, there may be provided a specification comparison (SC) process 3' after the CS process 3. The SC process 3' determines whether logic synthesis that satisfies the area and delay specifications of the functional macro is accomplished. If the result of the SC process 3' is NO, in other words if the specifications are not met, then the LSI automatic design procedure is returned to the MOL process 2. In other words, the SC process 3' has a design correction function. In such a case, it is required that a current logic synthesis result is reflected in the correlation between the area and the delay of each functional macro.

In the foregoing description, the signal bit-width is 4 bits. It is possible to change the width for each interconnection. The same effect can be obtained in such a case. Although a storage element is employed as a specification functional macro, other functional macros may be used with the same effect.

The invention claimed is:

1. An LSI (large-scale Integrated circuit) automatic design method for the automatic design of an LSI by means of design automation on the basis of the arithmetic/storage functioning of an electronic computer, said LSI automatic design method comprising;

(a) a netlist input process of inputting a netlist between functional macros;

(b) a macro outline layout process of creating an outline layout for functional macros by which relative positions of said functional macros are determined on the basis of said netlist and for determining a physical specification including areas and delays of said functional macros from said outline layout;

(c) a logic synthesis process of performing synthesis processing under said physical specification including areas and delays of said functional macros, wherein said logic synthesis process is performed after said macro outline layout process is performed; and (d) a layout process of putting logic circuits obtained in said logic synthesis process in said relative positions of said functional macros which are determined by said outline layout and laying out said logic circuits.

2. An LSI automatic design method for the automatic design of an LSI according to claim 1 wherein a layout result output process of outputting a layout result produced by said layout process is performed after said layout process.

3. An LSI automatic design method for the automatic design of an LSI according to claim 1 wherein a process of returning to said macro outline layout process when a comparison between a logic synthesis result of said logic synthesis process and said functional macro physical specification produces an intolerable difference and wherein said macro outline layout process is redone to reexamine said logic synthesis result.

4. An LSI automatic design method for the automatic design of an LSI according to claim 1 or claim 3,
said macro outline layout process comprising:
(a) an input process of inputting correlation information between the area and the delay of each functional macro;
(b) a relative placement process for determining a relative placement among a plurality of functional macros;
(c) a wiring delay calculation process for estimating the length of each wiring for interconnecting functional macros in said relative placement and for calculating, based on each said estimated wiring length, a maximum wiring delay;
(d) a macro delay/area decision process of determining, based on said correlation information, an area and delay combination for each functional macro in order that said maximum wiring delay falls in the range of predetermined LSI specifications; and
(e) an outline special wiring process of roughly performing special wiring, such as clock wiring and scan path wiring, between relative positions of said plurality of functional macros in said relative placement.

5. An LSI automatic design method for the automatic design of an LSI according to claim 4 wherein said LSI automatic design method includes an output process of outputting said relative placement determined in said relative placement process, said wiring length estimated in said wiring delay calculation process and said area and delay combination determined in said macro delay/area decision process as a placement specification, as a wiring specification and as a functional macro specification, respectively.

6. An LSI automatic design method for the automatic design of an LSI according to claim 4,
said relative placement process comprising:
(a) a wiring length minimization placement process of placing each functional macro, to aim at minimizing the length of wiring between functional macros; and
(b) an adjacent relationship decision process of determining, based on the placement result of each functional macro obtained in said wiring length minimization placement process, adjacent boundaries among a plurality of functional macros.

7. An LSI automatic design method for the automatic design of an LSI according to claim 6,
said adjacent relationship decision process comprising:
(a) an adjacent intermacro straight line creation process of providing straight lines each of which establishes a connection between two adjacent functional macros of a plurality of functional macros;
(b) a macro boundary straight line creation process of providing macro boundary straight lines so that each said macro boundary straight line passes through a point defined by dividing each said straight line by the ratio of the area of one of said two adjacent functional macro to the area of the other functional macro in a perpendicular direction to said straight line; and
(c) an adjacent boundary decision process of vertically or laterally standardizing the inclination of said macro boundary straight lines so as to determine boundaries among said plurality of functional macros.

8. An LSI automatic design method for the automatic design of an LSI according to claim 4 wherein said outline special wiring process is a process of performing rough clock wiring,
said outline special wiring process comprising:
(a) a register grouping process, which is focused on functional macros that have a register function, of arranging said register-function functional macros in groups of functional macros in close proximity to one another;
(b) an intragroup adjacent on-boundary wiring process of interconnecting functional macros of each said group on macro boundary straight lines;
(c) an intergroup adjacent on-boundary balance wiring process of interconnecting the barycenters of interconnection lines of each said group obtained in said intragroup adjacent on-boundary wiring process; and
(d) a clock input wiring process of establishing interconnection between an interconnection line obtained in said intergroup adjacent on-boundary balance wiring process and a clock external terminal at which a clock signal is applied.

9. An LSI automatic design method for the automatic design of an LSI according to claim 4 wherein said outline special wiring process is a process of performing rough clock wiring,
said outline special wiring process comprising:
(a) a register grouping process, which is focused on functional macros that have a register function, of arranging said register-function functional macros in groups of functional macros in close proximity to one another;
(b) an intragroup adjacent on-boundary wiring process of interconnecting functional macros of each said group on macro boundary straight lines;
(c) an intragroup register priority assignment process of assigning priorities to functional macros of each said group by weights according to the data transfer order of said functional macros;
(d) an intergroup adjacent on-boundary non-balance wiring process of calculating barycenters for interconnection lines of each said group obtained in said intragroup adjacent on-boundary wiring process by each said weight, to establish an interconnection between said barycenters; and
(e) a clock input wiring process of establishing interconnection between an interconnection line obtained in said intergroup adjacent on-boundary non-balance wiring process and a clock external terminal at which a clock signal is applied.

10. An LSI automatic design method for the automatic design of an LSI according to claim 4,
said outline special wiring process comprising:
(a) a peripheralmost register retrieval process of retrieving one of functional macros with a register function that is relatively placed nearest to the peripheral of said LSI; and
(b) a register sequential adjacent on-boundary wiring process of establishing an interconnection between said retrieved functional macro and a first functional macro next to said retrieved functional macro, of establishing an interconnection between said first functional macro and a second functional macro next to said first functional macro and of repeating such an interconnection process.

* * * * *